United States Patent
Pulugurtha et al.

(10) Patent No.: US 8,084,841 B2
(45) Date of Patent: Dec. 27, 2011

(54) SYSTEMS AND METHODS FOR PROVIDING HIGH-DENSITY CAPACITORS

(75) Inventors: MarkondeyaRaj Pulugurtha, Tucker, GA (US); Andreas Fenner, Chandler, AZ (US); Anna Malin, Phoenix, AZ (US); Dasharatham Janagama Goud, Tucker, GA (US); Rao Tummala, Greensboro, GA (US)

(73) Assignees: Georgia Tech Research, Atlanta, GA (US); Medtronic, Inc., Minneapolis, MN (US)

( * ) Notice: Subject to any disclaimer, the term of this patent is extended or adjusted under 35 U.S.C. 154(b) by 186 days.

(21) Appl. No.: 12/435,831

(22) Filed: May 5, 2009

(65) Prior Publication Data

US 2010/0283122 A1    Nov. 11, 2010

(51) Int. Cl.
*H01L 21/02* (2006.01)
*H01G 4/005* (2006.01)
(52) U.S. Cl. ......... 257/532; 257/E29.342; 257/E21.008; 438/381; 361/303
(58) Field of Classification Search .................. 257/532, 257/E29.342, E21.008; 438/381; 361/301.1, 361/329, 303
See application file for complete search history.

(56) References Cited

U.S. PATENT DOCUMENTS

| | | | |
|---|---|---|---|
| 5,138,412 A * | 8/1992 | Hieda et al. .................. 257/296 |
| 5,763,911 A | 6/1998 | Matthews et al. |
| 6,304,426 B1 * | 10/2001 | Wei et al. ..................... 361/502 |
| 6,638,830 B1 | 10/2003 | Tsai et al. |
| 6,872,591 B1 | 3/2005 | Wang et al. |
| 6,911,373 B2 | 6/2005 | Kellar et al. |
| 6,982,472 B2 | 1/2006 | Kiyotoshi |
| 7,262,075 B2 | 8/2007 | Aggarwal et al. |
| 2004/0264101 A1 * | 12/2004 | Hill ............................... 361/303 |
| 2005/0141171 A1 | 6/2005 | Borland |
| 2005/0274227 A1 | 12/2005 | Aggarwal et al. |
| 2006/0258327 A1 | 11/2006 | Lee et al. |
| 2006/0269762 A1 | 11/2006 | Pulugurtha et al. |
| 2007/0040204 A1 | 2/2007 | Pulugurtha et al. |
| 2007/0187739 A1 | 8/2007 | Liu et al. |
| 2008/0216298 A1 | 9/2008 | Dudnikov |
| 2009/0101956 A1 | 4/2009 | Booth, Jr. et al. |

OTHER PUBLICATIONS

Kumar, Manish, "High Density and High Reliability Thin Film Embedded Capacitors on Organic and Silicon Substrates", Master of Science Thesis, Georgia Institute of Technology, Dec. 2008, (abstract) [online]. Retrieved from the Internet on Jun. 9, 2010. Retrieved from: <URL:https://smartech.gatech.edu/bitstream/1853126655/1/Kumar_Manish_200812_MS.pdf.

International Search Report and Written Opinion dated Jun. 22, 2010 for related PCT Application No. PCT/US2010/031938.

International Search Report and Written Opinion dated Jun. 29, 2010 for PCT Application No. PCT/US2010/032107.

* cited by examiner

*Primary Examiner* — Lex Malsawma
(74) *Attorney, Agent, or Firm* — Ryan A. Schneider, Esq.; Troutman Sanders LLP

(57) ABSTRACT

The present invention describes systems and methods for providing high-density capacitors. An exemplary embodiment of the present invention provides a high-density capacitor system comprising a substrate and a porous conductive layer formed on the substrate, wherein the porous conductive layer is formed in accordance with a predetermined pattern. Furthermore, the high-density capacitor system includes a dielectric material formed on the porous conductive layer and a second conductive layer formed on the dielectric material. Additionally, the high-density capacitor system includes a plurality of conductive pads configured in communication with the second conductive layer.

37 Claims, 10 Drawing Sheets

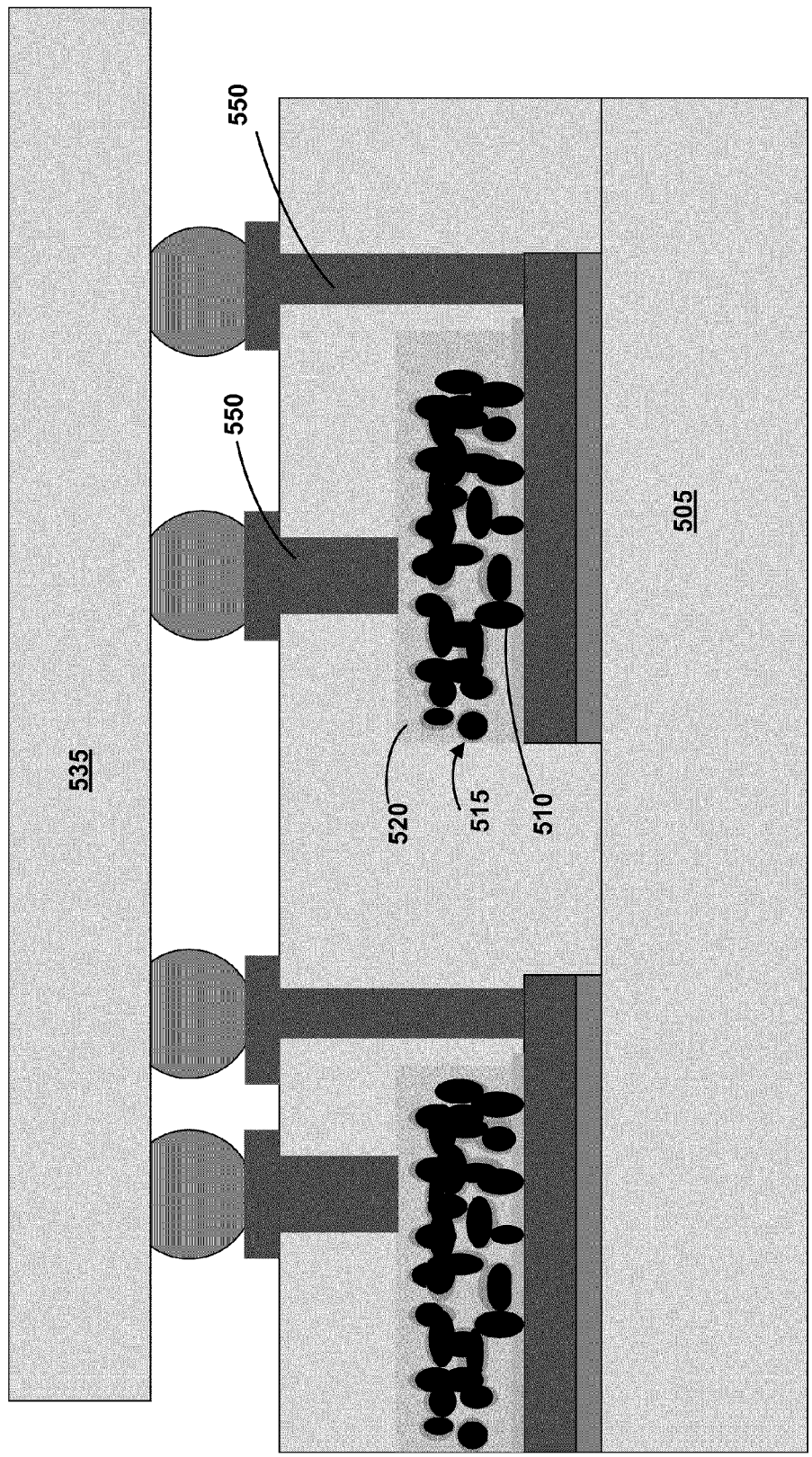

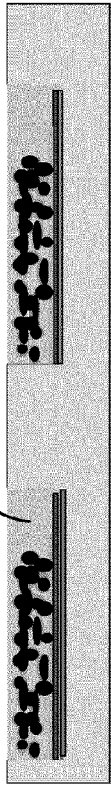
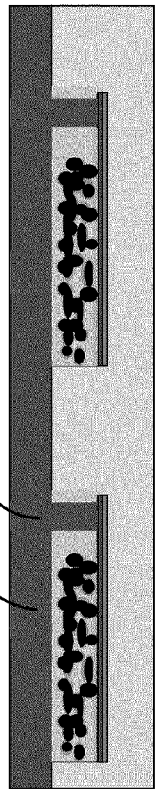
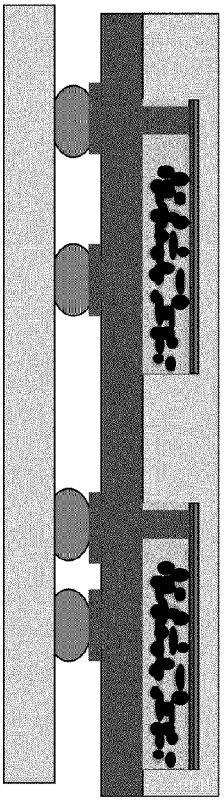
FIG. 8D
FIG. 8E
FIG. 8F
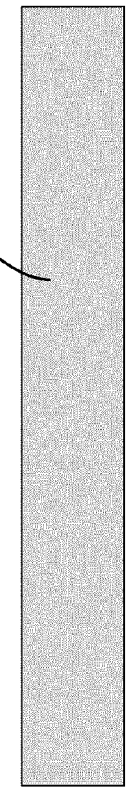
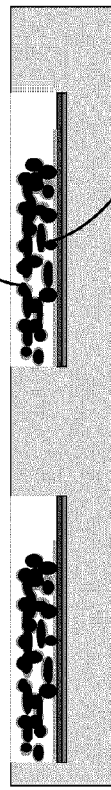
FIG. 8A
FIG. 8B
FIG. 8C

SYSTEMS AND METHODS FOR PROVIDING HIGH-DENSITY CAPACITORS

FIELD OF THE INVENTION

The present invention relates generally to systems and methods for providing high-density capacitors and, more particularly, to systems and methods for providing silicon compatible small form factor high-density capacitors.

BACKGROUND

Emerging applications in various electronic and biomedical fields require miniaturized capacitors with relatively high densities and high volumetric efficiencies. Implantable biomedical applications, for example, currently demand ultra-high capacitance densities with relatively low leakage currents at relatively high voltages. Conventional approaches to achieve high capacitance densities have sought to enhance one or more of three fundamental parameters: (a) higher permittivity dielectrics, (b) thinner films, and (c) enhancement in surface area. The first parameter is material-chemistry dependent and the second and third parameters are process-dependent. Advancements in conventional high-density capacitors have mainly been achieved in three types of devices: (1) trench capacitors, (2) multilayer ceramic capacitors, and (3) tantalum capacitors. FIG. 1 provides a graph of these three conventional capacitor architectures and the relationship between the area enhancement factor and the planar capacitance densities enabled by these devices. As shown in FIG. 1, certain conventional tantalum capacitors have been able to achieve effective capacitance densities of up to 40 $\mu F/cm^2$, with an area enhancement factor of up to around 100. Similarly, as shown in FIG. 1, certain conventional silicon trench capacitors have been able to achieve capacitance densities of between 2-40 $\mu F/cm^2$, with an area enhancement factor of up to around 50 for a device thickness of about 100 microns. Furthermore, certain conventional multilayer ceramic capacitors silicon trench capacitors have been able to achieve capacitance densities of around 40 $\mu F/cm^2$, with an area enhancement factor of up to around 40. While each of these areas of high-density capacitor development exhibit certain benefits advantages over prior designs, they are still largely insufficient to meet the demands of emerging applications.

The first category of conventional capacitors, trench capacitors, attempt to leverage the fundamental parameter of enhancement in surface area to increase capacitance density. As shown in FIG. 2, a silicon trench capacitor can be created by micromachining silicon and creating a three-dimensional surface. These silicon trenches are often etched by either a wet etching or a dry etching process. Once the trench has been etched, a thermal oxidation, nitradation, or oxynitradation process can be implemented to provide the dielectric layer for the insulator. By relying on developments in low-cost deep etching techniques and moderate k dielectric films, conventional trench capacitors have reached densities of as much as 40 $\mu F/cm^2$ with a stack of three trench capacitors.

While suitable for certain implementations, trench capacitors fail to meet the requirements for many applications because they cannot provide the capacitance density required and the volumetric efficiency required. Trench capacitors fail to meet the volumetric efficiency required for many applications because there is an elastic relationship between the depth of the trench and the capacitance density of the trench capacitor. Therefore, higher capacitance requires a deeper trench and an increase in the volume of the device.

The second category of capacitors, multilayer ceramic capacitors or MLCCs, attempt to provide high-density capacitive structures by implementing a stack of metal and dielectrics, comprised of ceramic material. As shown in FIG. 3, these layers can be stacked alternatively to form a multi-layered capacitor. Conventional multilayer ceramic capacitors have reduced the thickness of the dielectric layers to permit an increase in the number of layers in the same die size package; thus, increasing the capacitance density of the package. The ability to fabricate thin dielectric layers of ceramic materials is heavily dependent upon the ability to create highly dispersed, fine-grained ceramic powders. Furthermore, the volumetric efficiency of the multilayer ceramic capacitors increases with a reduction in electrode and dielectric thickness. Conventional multilayer ceramic capacitors fabrication processes have successfully achieved dielectric and electrode thickness of around 2 to 3 microns, resulting in 30 to 50 layers for a 100 micron capacitor device, which can provide a capacitance density of around 60 $\mu F/cm^2$.

While suitable for certain implementations, multilayer ceramic capacitors fail to meet the requirements for many applications because they cannot provide the capacitance density required, the volumetric efficiency required, and they are not often silicon compatible. The fabrication of multilayer ceramic capacitors is a highly complex process due to the multiple layers of the device. Furthermore, MLCC fabrication must be carried out at high temperatures, which are incompatible with silicon-based implementations. Additionally, multilayer ceramic capacitors require oxidation resistant electrodes to preserve the integrity of the device. Furthermore, one of the most significant drawbacks to multilayer ceramic capacitors architectures is that they require lead connections, which limit the volumetric efficiency of the device and can result in reliability issues.

The third category of conventional capacitors, tantalum capacitors, attempt to optimize the surface area of the tantalum powder used as the electrode for the capacitor to achieve high capacitive densities. As shown in FIG. 4, the bottom electrode of a conventional tantalum capacitor can be comprised of a pellets of grains or flakes of tantalum powder. These pellets, shown in FIG. 4, of tantalum powder typically contain voids which can be leveraged by a conformal dielectric to increase the surface area of the capacitive component. Certain conventional tantalum capacitor implementations have achieved a capacitance density of around 20 $\mu F/cm^2$ for Break Down Voltage ("BDV") value of 15. In 6 V implementations, conventional tantalum capacitors have achieved an equivalent capacitance density of around 140 $\mu F/cm^2$.

While suitable for certain implementations, tantalum capacitors fail to meet the requirements for many applications because they cannot provide the capacitance density required, the volumetric efficiency required, and they are not silicon compatible. The fabrication of tantalum capacitors requires sintering of the tantalum pellets at temperatures of around 1900° C., which is incompatible with silicon-based implementations. Additionally, the dielectric is formed through an anodization, creating tantalum oxide, which has disadvantages as a dielectric material because the device has poor reliability under certain polarity conditions. Furthermore, one of the most significant drawbacks to tanatalum capacitor architectures is that it cannot be sintered on a silicon carrier which makes it difficult to pattern and form independent electrodes. Another major fundamental limitation is that conventional tanatalum capacitor architectures are limited to tantalum oxide dielectrics.

Therefore, it would be advantageous to provide an apparatus and method for efficiently and effectively providing high-density capacitors.

Additionally, it would be advantageous to provide an apparatus and method to provide a thin, planar high-density capacitor interposer that can be implemented in a silicon compatible processes.

Additionally, it would be advantageous to provide an improved system and method for providing a high-density capacitor with independent terminals and discrete capacitor components.

BRIEF SUMMARY

The present invention describes systems and methods for providing high-density capacitors. An exemplary embodiment of the present invention provides a high-density capacitor system comprising a substrate and a porous conductive layer formed on the substrate, wherein the porous conductive layer is formed in accordance with a predetermined pattern. Furthermore, the high-density capacitor system includes a dielectric material formed on the porous conductive layer and a second conductive layer formed on the dielectric material. Additionally, the high-density capacitor system includes a plurality of conductive pads configured in communication with the second conductive layer.

In addition to high-density capacitor systems, the present invention provides a method for providing a high-density capacitor including the steps of providing a substrate and depositing a porous conductive layer onto the substrate in accordance with a predetermined pattern. Furthermore, the method for providing a high-density capacitor includes the steps of depositing a dielectric material onto the porous conductive layer, forming a second conductive layer on the dielectric material, and forming a plurality of conductive pads in communication with the second conductive layer.

These and other objects, features and advantages of the present invention will become more apparent upon reading the following specification in conjunction with the accompanying drawing figures.

BRIEF DESCRIPTION OF THE FIGURES

FIG. 5C provides an illustration of a high-density capacitor system 500 in accordance with an exemplary embodiment of the present invention including TSVs 550.

FIGS. 8A-8F provide an illustration of a high-density capacitor system 500 in accordance with an exemplary embodiment of the present invention, in which the high-density capacitor system 500 has troughs 805 in the substrate 505.

DETAILED DESCRIPTION

Figure 1:
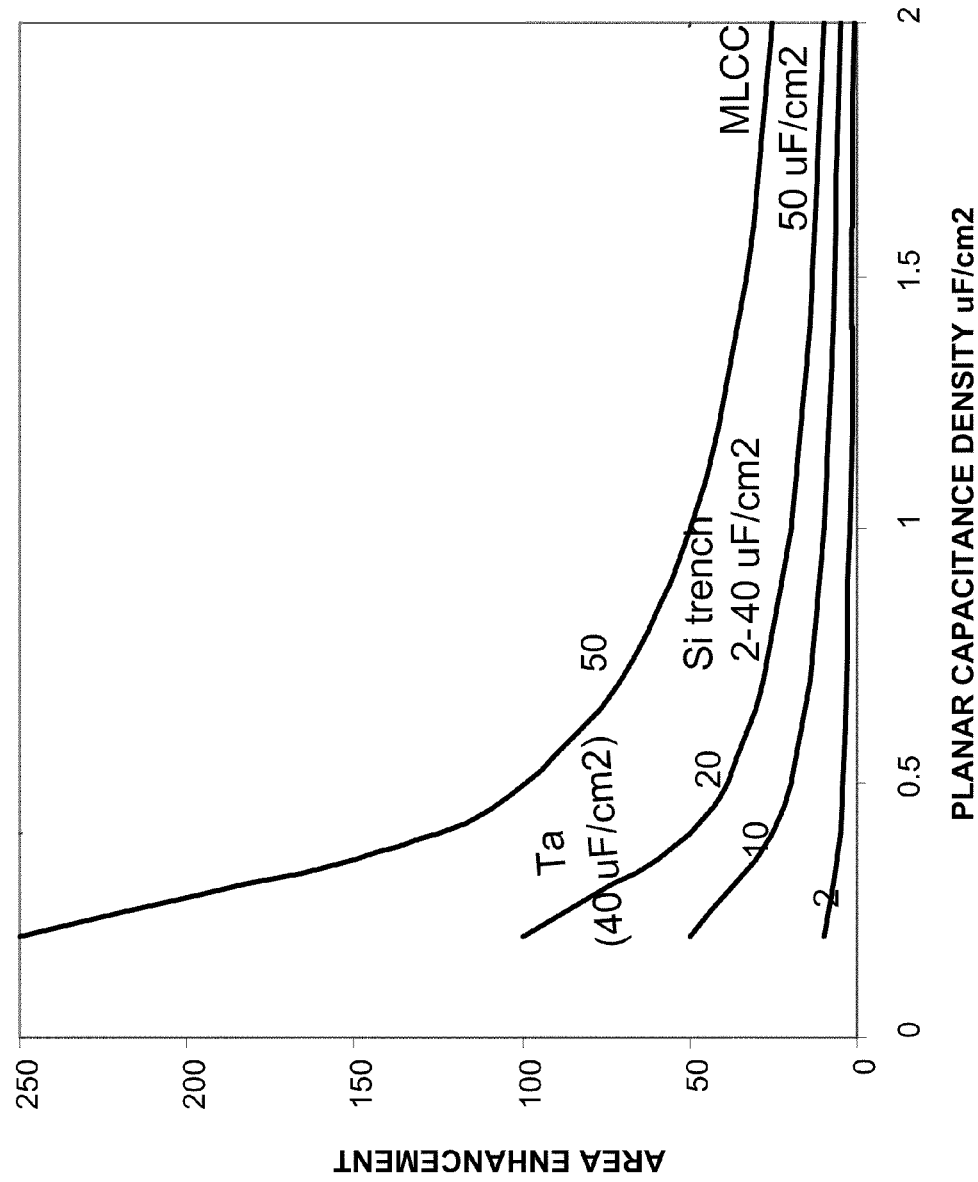
FIG. 1 provides a graph of three conventional capacitor architectures and the relationship between the area enhancement factor and the planar capacitance densities enabled by these devices.
Figure 2:
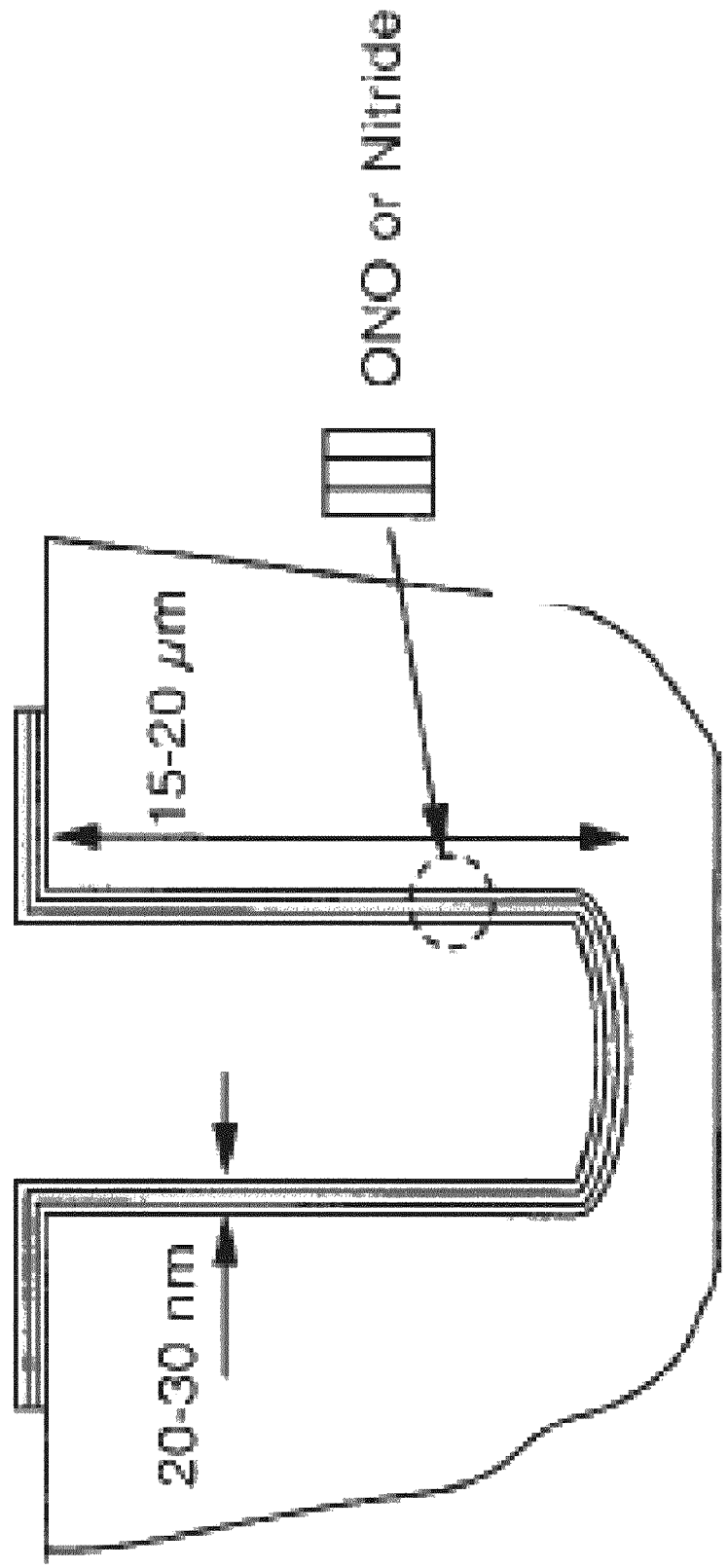
FIG. 2 provides an illustration of a conventional silicon trench capacitor.
Figure 3:
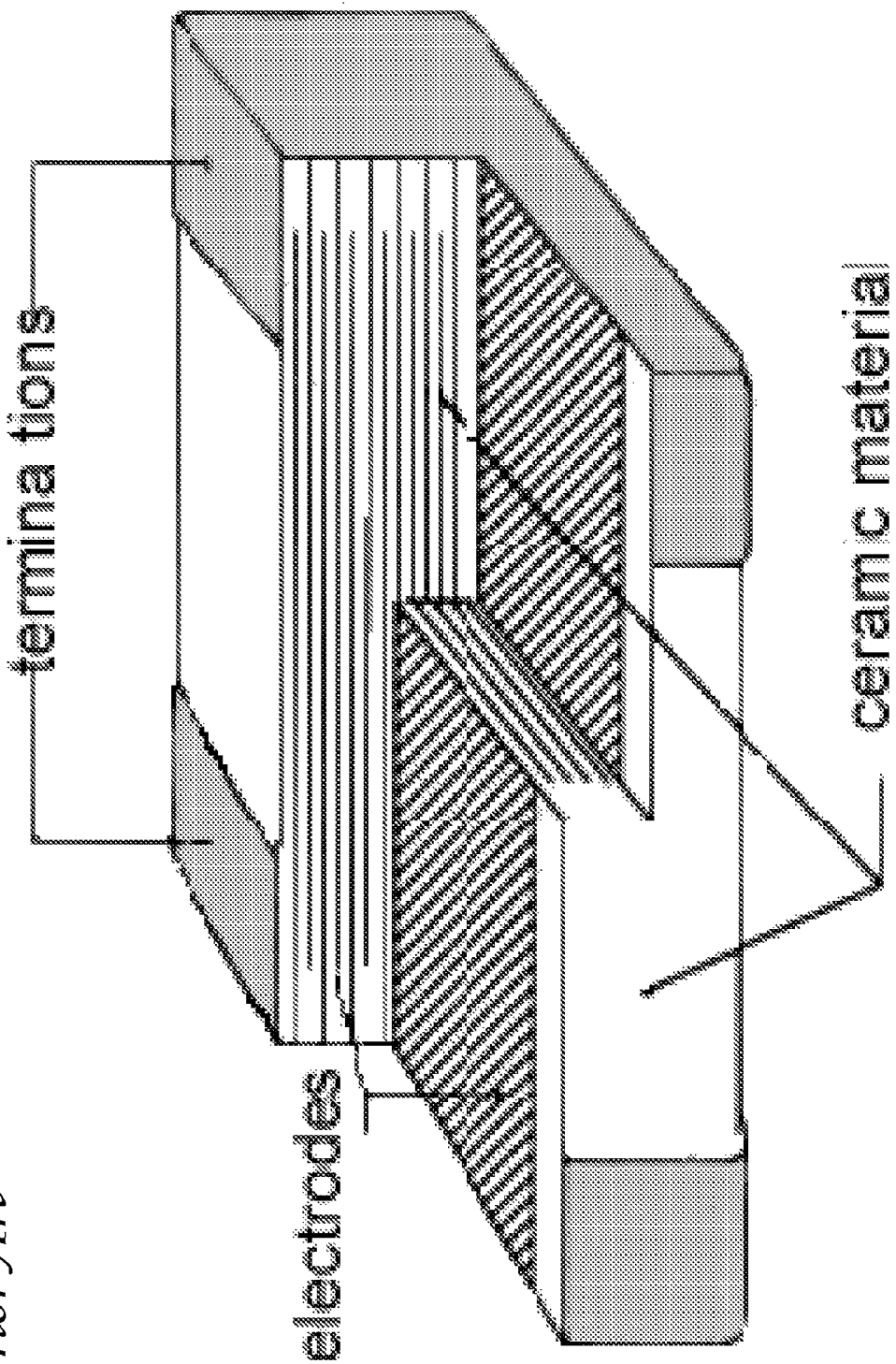
FIG. 3, provides an illustration a conventional a multilayered ceramic capacitor.
Figure 4:
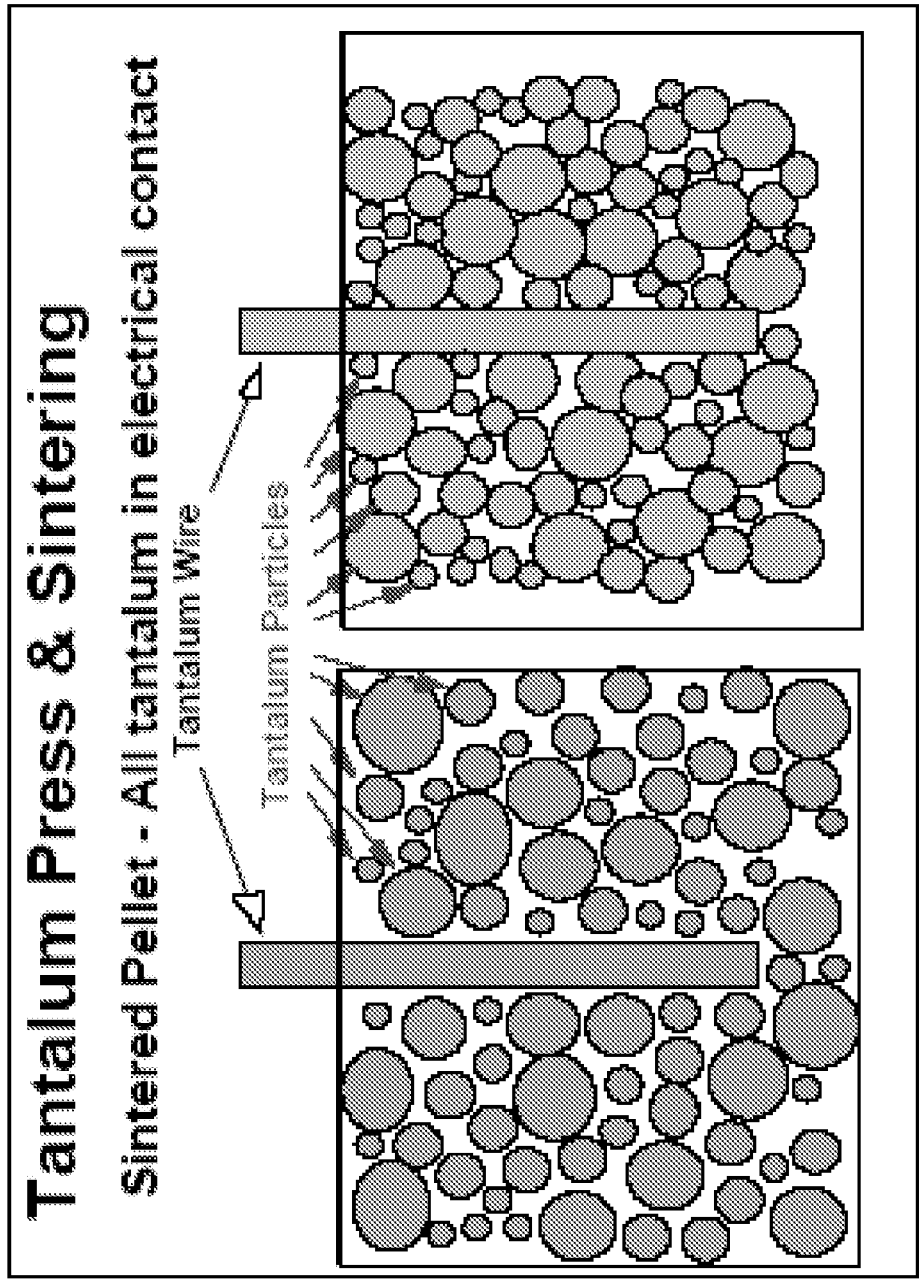
FIG. 4, provides an illustration of the pellets of grains or flakes of tantalum powder of a conventional tantalum capacitor.

The present invention addresses the deficiencies in the prior art concerning the inability to provide volumetrically efficient capacitors. Significantly, the present invention provides methods and apparatus for providing high-density planar capacitors. A thin film capacitor device provided in accordance with the present invention is enabled to be silicon compatible and provide independently addressable terminals. Additionally, the present invention overcomes the drawbacks of the conventional methods and systems in the prior art and provides systems and methods enabled to provide high-density capacitors that can be implemented along with integrated circuit boards in a silicon stack package.

An exemplary embodiment of the present invention provides a high-density capacitor system comprising a substrate and a porous conductive layer formed on the substrate, wherein the porous conductive layer is formed in accordance with a predetermined pattern. Furthermore the high-density capacitor system includes a dielectric material formed on the porous conductive layer and a second conductive layer formed on the dielectric material. Additionally, the high-density capacitor system includes a plurality of conductive pads configured in communication with the second conductive layer.

In addition to high-density capacitor systems, the present invention provides a method for providing a high-density capacitor including the steps of providing a substrate and depositing a porous conductive layer onto the substrate in accordance with a predetermined pattern. Furthermore, the method for providing a high-density capacitor includes the steps of depositing a dielectric material onto the porous conductive layer, forming a second conductive layer on the dielectric material, and forming a plurality of conductive pads in communication with the second conductive layer.

The high-density capacitor systems enabled by the present invention present significant advantages to biomedical applications, such as biomimetic implants and biomedical neural stimulators. Because the high-density capacitor systems enabled by the present invention provide significant advancements in both volumetric efficiency and capacitance density, they can provide the necessary capacitor components for a miniaturized biomedical implant and also meet the geometric constraints of the application. In addition to biomedical applications, the high-density capacitor systems enabled by the present invention can be implemented in almost any application that demands a relatively high amount of current in short intervals. For example, and not limitation, an exemplary embodiment of the high-density capacitor system can be implemented in a low impedance power supply to assist with noise suppression. In another non-limiting example, an exemplary embodiment of the high-density capacitor system can be used in a pulse power supply to assist in providing sudden bursts of power for impulse applications such as activating the flash on a digital camera or accessing a memory stick of a portable memory device. Additionally, an exemplary embodiment of the high-density capacitor system can be implemented in power conversion applications to step-up and/or step-down voltages, such as stepping-down the voltage from a 5V circuit to a 3.3V circuit. Furthermore, an exemplary embodiment of the high-density capacitor system could be used in conjunction with a high speed microprocessor as a decoupling device.

Figure 5A:
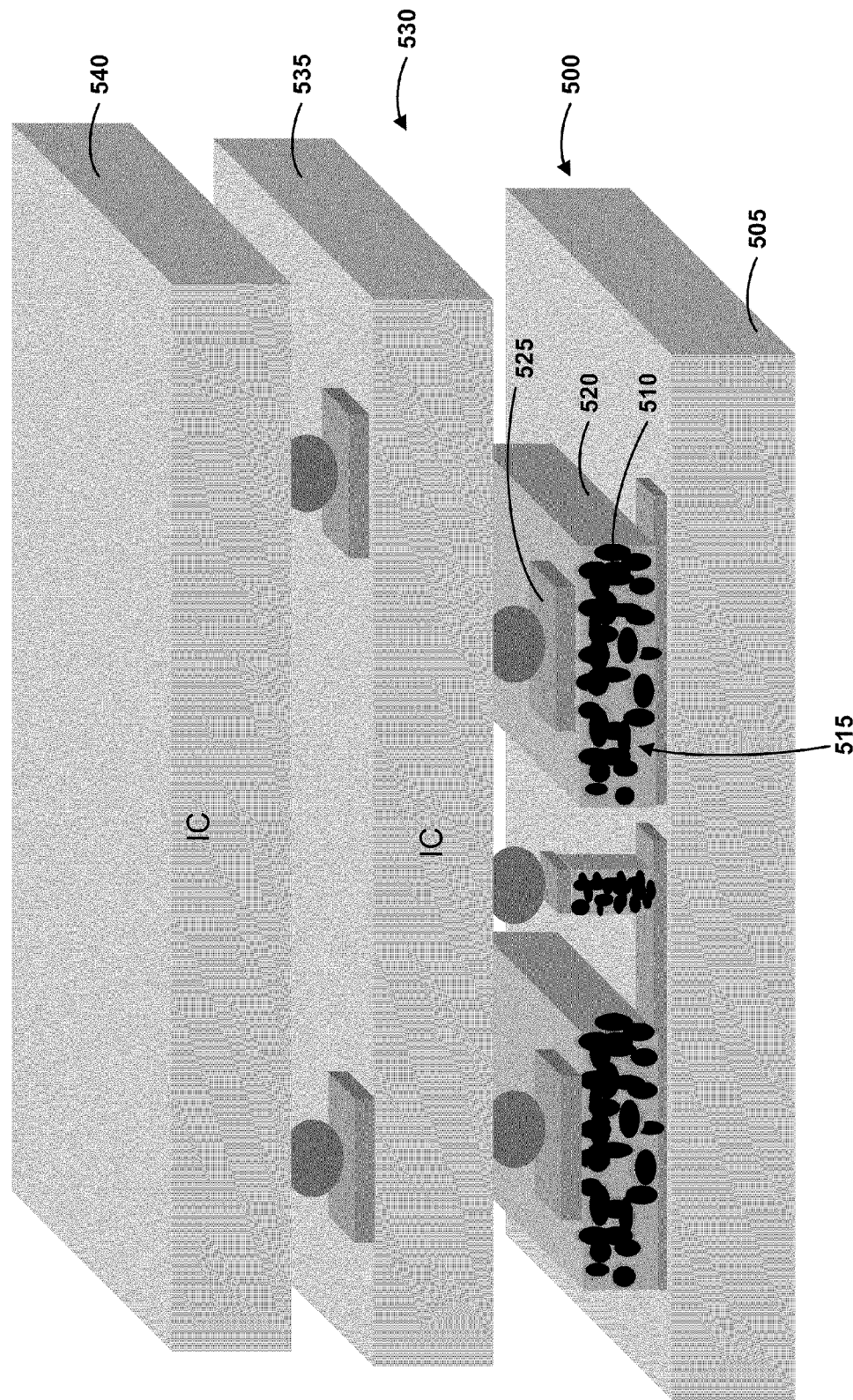
FIG. 5A provides an illustration of a high-density capacitor system 500 in accordance with an exemplary embodiment of the present invention.

FIG. 5A provides an illustration of a high-density capacitor system 500 in accordance with an exemplary embodiment of the present invention. As shown in the exemplary embodiment of FIG. 5A, the high-density capacitor system 500 can be configured in a silicon stack package 530. Therefore, an exemplary embodiment of the high-density capacitor system 500 can comprise one layer of a silicon stack package 530. In accordance with an exemplary embodiment the present invention, the high-density capacitor system 500 can be silicon compatible and configured to interface with integrated circuit layers 535 and 540 of the silicon stack package 530. The ability to implement in a silicon stack package 530 provides many advantages over the prior art. Many conventional capacitors are discrete devices that are necessarily thicker structures due to packaging and lead components, and, furthermore, are often not compatible with silicon stack implementations. An exemplary embodiment of the high-density capacitor system 500 is compatible with the silicon stack package 530. Furthermore, the exemplary embodiment of the high-density capacitor system 500 is a thin film component; thus, it can be implemented in a silicon stack package 530 with relatively little cost to the overall architecture of the package 530 related to the relatively small increase in height resulting from the insertion of the high-density capacitor system 500 into the silicon stack package 530. Therefore, an exemplary embodiment of the high-density capacitor system 500 can provide all the capacitance required by a particular silicon stack device.

As shown in FIG. 5A, an exemplary embodiment of the high-density capacitor system 500 provides a substrate 505. In an exemplary embodiment, this substrate layer 505 can be comprised of silicon, glass, ceramic, or other suitable types of silicon compatible materials. A porous conductive layer 510 is formed on the substrate 505, as shown in FIG. 5A, to provide the bottom electrode of an exemplary embodiment of the high-density capacitor system 500. In an exemplary embodiment of the high-density capacitor system 500, the porous conductive layer 510 is comprised of nanoelectrode particulate. The term "porous conductive layer" is used herein to describe an electronically conducting layer that has a random open porosity and is comprised of nanoelectrode particulate. The term "nanoelectrode particulate" is used herein to refer to elements comprising metal particles, diatoms, and/or ceramic particles or a combination thereof. Those of skill in the art will appreciate that the porous conductive layer 510 can be fabricated by a variety of suitable methods.

In an exemplary embodiment, the porous conductive layer 510 can be comprised of metal particles or melt-cast layers with a decomposable polymer to control the pore distribution and porosity. Therefore, in an exemplary embodiment the porous conductive layer 510 can include depositing the nanoelectrode particulate along with a sacrificial polymer, which can be etched or burned when the metal is in molten form to induce the porosity of the porous conductive layer 510. Therefore, in an exemplary embodiment of the high-density capacitor system 500, the porous conductive layer 510 can be delivered in a paste and then sintered to decompose the polymer within the paste, resulting in the porous conductive layer 510. In an exemplary embodiment, the porosity can be controlled by introducing pore-generating polymers, where the polymers can be in a solution, emulsion or granules. In the exemplary embodiment relying upon emulsions and granules, the porosity of the porous conductive layer can be controlled by the polymer size distribution. By enabling control over the pore density and the porosity of the porous conductive layer 510, an exemplary embodiment of the high-density capacitor system 500 can enable some control over the area the enhancement factor of the system 500. In an exemplary embodiment, the porous conductive layer 510 is comprised of nanoelectrode particulate that provides a relatively high surface area. More particularly, the porous nature of the formation of the nanoelectrode particulate into the porous conductive layer 510, in an exemplary embodiment, provides a conductive layer with a significantly enhanced surface area. The highly porous and contoured nature of the conductive layer 510 provides a jagged structure with significantly enhanced three-dimensional surface contours. The significantly enhanced three-dimensional surface contours of the porous conductive layer 510 greatly increases the area-enhancement factor of the exemplary embodiment of the high-density capacitor system 500; thus, increasing the capacitance density of the high-density capacitor system 500. An increase in the area-enhancement factor can yield higher capacitance densities because the tortuous nature of the surface contours of the porous conductive layer 510 increase the effective electrode area without increasing the area occupied by the electrode on the substrate 505. Therefore, the surface area of the bottom electrode, the porous conductive layer 510, is greatly increased, without an increase in the surface area of the substrate 505.

In an exemplary embodiment, the nanoelectrode particulate can be comprised of a material with a low temperature sinterable base metal or valve metal of the high-density capacitor system 500 in order to be silicon compatible. In an exemplary embodiment, the nanoelectrode particulate of the porous conductive layer 510 can be comprised of a base metal, such as copper, nickel, or a valve metal, such as titanium, niobium, aluminum or tantalum.

One of the significant advantages of the present invention is that an exemplary embodiment of the high-density capacitor system 500 can enable the porous conductive layer 510 to be formed on the substrate in accordance with a predetermined pattern. The ability to form the porous conductive layer 510 on the substrate 505 in specified predetermined pattern enables numerous benefits. First, the pattern for an exemplary embodiment of the porous conductive layer 510 can be configured in accordance with the capacitor requirements for a given implementation, device, or product. Second, the pattern for the exemplary embodiment of the porous conductive layer 510 can be configured so that the capacitive components created can be connected to independent terminals and be independently addressable. For example, and not limitation, a first circuit on a integrated circuit board may require a 10 µF capacitor, a second circuit may require a 100 µF capacitor, and a third circuit on the integrated circuit board may require a 50 µF capacitor. Given these requirements, the predetermined pattern for an exemplary embodiment of the porous conductive layer 110 of the high-density capacitor system 500 can be configured to provide a capacitive array providing each of the desired 10 µF, 50 µF, and 100 µF capacitor components. Furthermore, these 10 µF, 50 µF, and 100 µF capacitor components in an exemplary embodiment of the high-density capacitor system 500 can be independently addressable through independent terminals for each discrete capacitor component.

Thus, a significant advantage of an exemplary embodiment of the high-density capacitor system 500 is that independent terminals can be provided for the various capacitive components created within the high-density capacitor system 500. Furthermore, each individual high-density capacitor system 500 can be designed to provide different capacitive components depending upon the requirements of a given implementation. Much like laying out the circuit for an integrated circuit design, the predetermined pattern for the porous conductive layer 510 can be designed to provide a layout of desired capacitor components.

As shown in FIG. 5A, an exemplary embodiment of the high-density capacitor system 500 additionally provides a dielectric material 515 formed on the porous conductive layer 510. The dielectric material 515 in an exemplary embodiment of the high-density capacitor system 500 can be a material with relatively high insulation resistance and moderate permittivity. Furthermore, the dielectric material 515 in an exemplary embodiment can have a relatively low voltage coefficient of permittivity, low temperature coefficient of permittivity, low voltage derating beyond 85° C., better intrinsic electrical reliability because of lower susceptibility to defects such as vacancies and interfacial traps, and low temperature processing so that electrodes and interfaces are stable during the deposition process. In some embodiments, the dielectric material 515 can be multicomponent oxides. For example, and not limitation, the dielectric material 515 in one embodiment can be alumina or strontium titanate.

In an exemplary embodiment, the dielectric material 515 is deposited onto the porous conductive layer 510 of the high-density capacitor system 500 such that is highly conformal to the porous conductive layer 510 and can provide a relatively high insulation resistance coating. The ability of the dielectric material 515 to provide a relatively high insulation coating enables an exemplary embodiment of the high-density capacitor system 500 to provide a more efficient energy storage area in which a relatively high amount of charge may be stored at a given energy level; thus, providing a more ideal capacitor. The dielectric material 515 in an exemplary embodiment can be deposited by various methods such as Atomic Layer Deposition (ALD) with vapors or solutions where dielectric formation is obtained by sequential reaction with different precursors. The dielectric material 515 can also be formed by anodization with certain nanoelectrodes.

As shown in FIG. 5A, an exemplary embodiment of the high-density capacitor system 500 additionally provides a second conductive layer 520 formed on the dielectric material 515. In an exemplary embodiment, this second conductive layer 520 is the top electrode of the high-density capacitor system 500. The second conductive layer 520 can be comprised of a variety of suitable conducting materials, including a conducting polymer, metals, or conducting oxides. Furthermore, the second conductive layer 520 in an exemplary embodiment can be separated from the dielectric material 515 by a thin isolation barrier in order to improve the relationship between the dielectric material 515 and the top electrode formed by the second conductive layer 520. In an exemplary embodiment, the second conductive layer 520 is comprised of a conductive polymer. In an exemplary embodiment the conductive polymer of the conductive layer 520 can be in-situ polymerized or prepolymerized and dispensed as nanodispersions. Those of skill in the art will appreciate that prepolymerized polymers of an exemplary embodiment of the conductive layer 520 can be free of reactive species that are more inert to the ALD films. Additionally, in-situ polymerization in some embodiments can result in acidic solutions that are reactive, but are more penetrating into the nanoelectrode particulate. The second conductive layer 520 in some embodiments can be a highly doped conducting polymer with improved conductivity or even MnO2 or similar conducting oxides. The second conductive layer 520 in an exemplary embodiment can also be deposited by a metal precursor solution that is converted to oxides or metals by gas phase reduction. As another example, the second conductive layer can be conducting liquids or liquid electrolytes that are hermetically packaged. For example, and not limitation, the second conductive layer 520 can be a conformally deposited metal from a chemical vapor deposition ("CVD") or a atomic layer deposition ("ALD") process such as titanium nitride and doped polysilicon. In another embodiment, the second conductive layer is separated from the dielectric by means of a barrier or protection layer to enhance the electrical performance and reliability. The second conducting layer can also be thin metals deposited from wet metallization techniques such as electroless copper, nickel, gold etc. In order to be compatible with silicon stacking, an exemplary embodiment of the second conductive layer 520 must be resistant to cracking and delamination during the silicon stack assembly and thermal cycling. Additionally, the conductive polymer second conductive layer 520 can act as a stress buffer to mitigate stress on the high-density capacitor system 500 in an exemplary embodiment. The second conductive layer 520 in an exemplary embodiment can be stable at temperatures below 500° C., have a relatively low resistivity, provide self-healing attributes, provide adequate strength and toughness to provide mechanical stability, and be amenable to subsequent copper metallization.

As shown in FIG. 5A, an exemplary embodiment of the high-density capacitor system 500 additionally provides numerous conductive pads 525. These conductive pads 525 can be formed in communication with second conductive layer 520 of an exemplary embodiment of the high-density capacitor system 500. Those of skill in the art will appreciate that these conductive pads 525 can provide the interconnect leads to the high-density capacitor system 500. As provided above, one of the significant advantages provided by an exemplary embodiment of the high-density capacitor system 500, is that the discrete capacitor components of the system 500 can have independent terminals. The conductive pads 525 shown in FIG. 5A can provide interconnects to these independent terminals of the capacitive components of an exemplary embodiment of the high-density capacitor system 500.

In some embodiments, the high-density capacitor system 500 can be connected to other chips via conventional wire bonding techniques. Alternatively, in an exemplary embodiment, the conductive pads 525 can be interconnected with other boards, such as integrated circuit board 535, via microbump connections or flip chip connections. These microbumps can be solder bumps that are deposited on the conductive pads 525 of an exemplary embodiment of the high-density capacitor system 500. In an exemplary embodiment, the microbumps can be aligned so that they align with matching pads on an external circuit, such as integrated circuit board 535, and then the solder can be flowed to complete the interconnection.

An additional significant advantage of the high-density capacitor system 500 provided in accordance with an exemplary embodiment of the present invention, is that high-density capacitor system 500 can be implemented in a silicon stack package 530 and interconnected with other layers of the silicon stack package 530 with Through-Silicon-Via ("TSVs"). Those of skill in the art will appreciate that TSVs are a vertical electrical connection passing completely through a silicon wafer or die. TSV technology is advantageous for creating 3D packages and 3D integrated circuits, such as the biomedical implantable devices enabled by a silicon stack package 530 utilizing an exemplary embodiment of the high-density capacitor system 500. TSVs can also eliminate certain process integration issues associated with metallization, bump or bonding pad formation and assembly. Lacing and wiring the layers of a silicon stack package 530 with TSV interconnects provide many benefits, including higher clock rates, lower power dissipation, and higher integration density. Those of skill in the art will appreciate that 3-D TSV technology can be used to solve issues related to electrical performance, memory latency, power, and noise on and off the chip.

In an exemplary embodiment, the silicon stack package 530 shown in FIG. 5A provides a System-In-a-Package ("SIP"). The SIP architecture can provide many of the benefits of proposed System-On-a-Chip ("SOC") architectures, while at the same providing a much more practical and achievable solution than some SOC architectures. SOC's can suffer from long development time and high development costs, mainly because it is difficult to make an entire system of differently functioning circuit blocks work on a single chip. 3D packaging technology, on the other hand, can rely on more readily available integrated circuit boards, and other discrete component layers, and put them together in a single package. In accordance with an exemplary embodiment of the present invention, the high-density capacitor system 500 can significantly advance 3D packaging implementations, by providing necessary capacitive components for integrated circuit designs in a thin film interposer that is silicon compatible. Therefore, the SIP architecture enabled by an exemplary embodiment of the high-density capacitor system 500 can be implemented in a package equivalent in size to an SOC architecture, but with the benefits and efficiencies of a SIP architecture.

An exemplary embodiment of the high-density capacitor system 500 can be implemented in silicon stack and comport with IC type packaging constraints. Additionally, an exemplary embodiment of a high-density capacitor system 500 can require very few constraints when assembled into a thin film die stack in comparison to the construction of a conventional capacitor device on a Printed Wiring Board ("PWB"), requiring the fabrication of solder pads on the board and traces with appropriate spacing to avoid solder reflow. The silicon stack package 530, including an exemplary embodiment of the high-density capacitor system 500, can provide efficient and reliable interconnects to the IC boards 535 and 540 in a small die package.

Figure 5B:
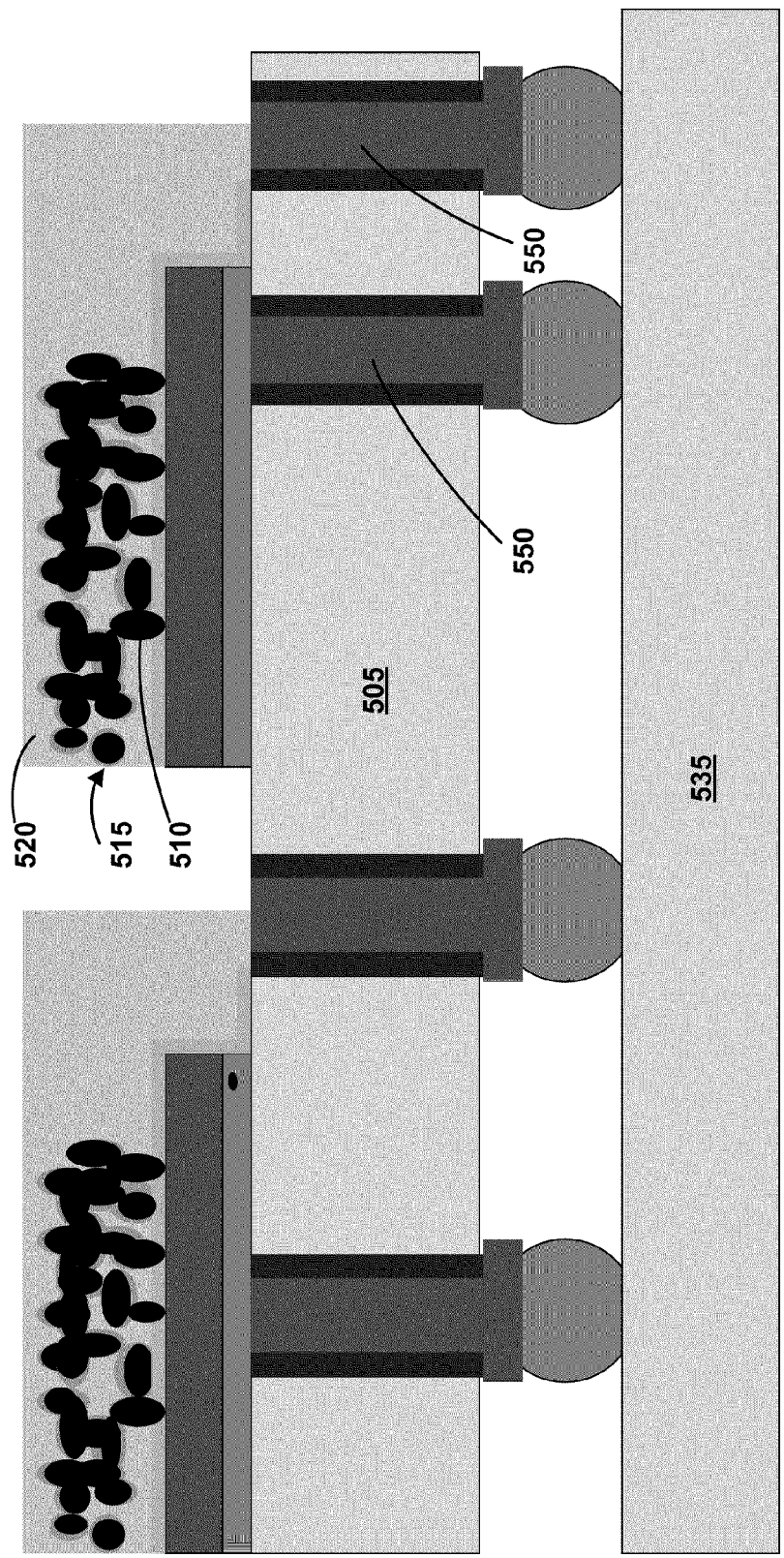
FIG. 5B provides an illustration of a high-density capacitor system 500 in accordance with an exemplary embodiment of the present invention including TSVs 550.

FIG. 5B provides an illustration of a high-density capacitor system 500 in accordance with an exemplary embodiment of the present invention including TSVs 550. The TSVs 550 in the exemplary embodiment of the high-density capacitor system 500 shown FIG. 5B provide vertical electrical connections that pass completely through the substrate 505. The exemplary embodiment of the high-density capacitor system 500 shown in FIG. 5B provides a substrate 505 and a porous conductive layer 510 formed on the substrate 505. In an exemplary embodiment, the dielectric material 515 is deposited onto the porous conductive layer 510 of the high-density capacitor system 500 such that is highly conformal to the porous conductive layer 510. As shown in great detail in FIG. 5B, the porous conductive layer 510 provides a very jagged and contoured surface. The highly porous and contoured nature of the conductive layer 510 enables significant enhancement of the three-dimensional surface contours of the conductive layer 510. Therefore, in accordance with an exemplary embodiment of the present invention, the bottom electrode formed by the porous conductive layer 510 provides a relatively large area-enhancement factor. The high area enhancement factor enabled by the porous conductive layer 510 significantly increases the capacitance density of the high-density capacitor system 500.

As shown in FIG. 5B, an exemplary embodiment of the high-density capacitor system 500 additionally provides a second conductive layer 520 formed on the dielectric material 515. As shown in FIG. 5B, the TSVs 550 can provide a connection to both the bottom electrode and the top electrode of the high-density capacitor system 500 through the entire substrate 505. The exemplary embodiment of the high-density capacitor system 500 provides TSVs 550 to enable connection to other layers or devices. In the exemplary embodiment, the TSVs 550 are connected via microbumps to an integrated circuit layer 535. Therefore, the TSVs of an exemplary embodiment of the high-density capacitor system 500 can enable a vertically oriented silicon stack package.

FIG. 5C provides an illustration of a high-density capacitor system 500 in accordance with an exemplary embodiment of the present invention including TSVs 550. The TSVs 550 in the exemplary embodiment of the high-density capacitor system 500 shown FIG. 5C provide vertical electrical connections that pass completely through the substrate 505. The exemplary embodiment of the high-density capacitor system 500 shown in FIG. 5C provides a substrate 505 and a porous conductive layer 510 formed on the substrate 505. In an exemplary embodiment, the dielectric material 515 is deposited onto the porous conductive layer 510 of the high-density capacitor system 500 such that is highly conformal to the porous conductive layer 510. As shown in great detail in FIG. 5C, the porous conductive layer 510 provides a very jagged and contoured surface. The highly porous and contoured nature of the conductive layer 510 enables significant enhancement of the three-dimensional surface contours of the conductive layer 510.

As shown in FIG. 5C, an exemplary embodiment of the high-density capacitor system 500 additionally provides a second conductive layer 520 formed on the dielectric material 515. As shown in FIG. 5C, the TSVs 550 can provide a connection at the top of the system 500 to both the bottom electrode and the top electrode of the high-density capacitor system 500. The exemplary embodiment of the high-density capacitor system 500 provides TSVs 550 to enable connection to other layers or devices. In the exemplary embodiment, the TSVs 550 are connected via microbumps to an integrated circuit layer 535. Therefore, the TSVs of an exemplary embodiment of the high-density capacitor system 500 can enable a vertically oriented silicon stack package.

Figure 6:
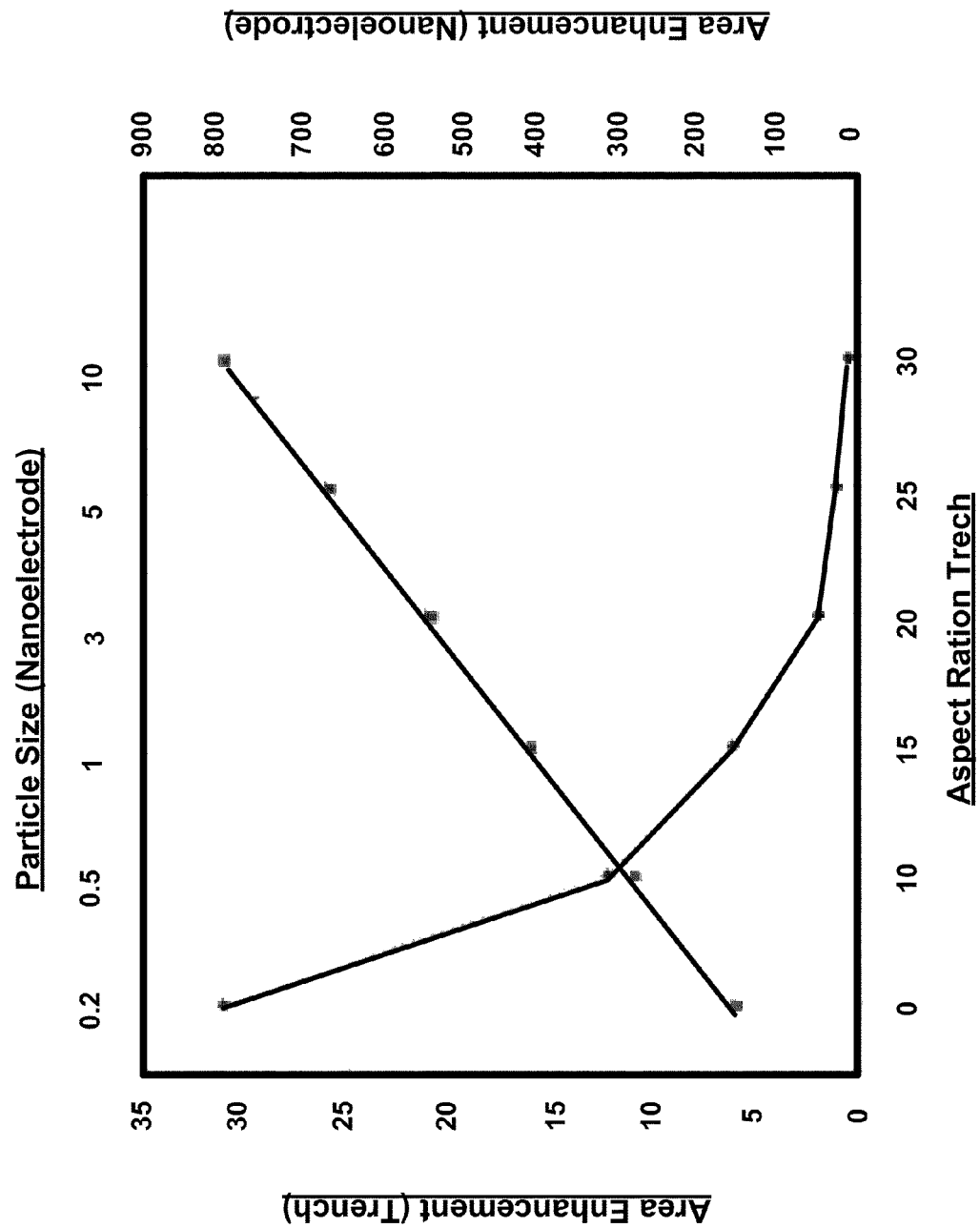
FIG. 6 provides a graphical comparison of the area enhancement factor and aspect ratios associated with exemplary embodiments of the high-density capacitor system 500 and conventional trench capacitors.

FIG. 6 provides a graphical comparison of the area enhancement factor and aspect ratios associated with exemplary embodiments of the high-density capacitor system 500 and conventional trench capacitors. As shown in the graph in FIG. 6, the area enhancement factor for conventional trench capacitors is significantly less than the area enhancement factor for a high-density capacitor system 500 provided in accordance with an exemplary embodiment of the present invention. For example, the conventional trench capacitors graphed in FIG. 6 exhibited an area enhancement factor of between 25 and 30, while the exemplary embodiments of the high-density capacitor systems 500 exhibited an area enhancement factor of between 500 and 700. Furthermore, the graph in FIG. 6 illustrates that some of the conventional trench capacitors exhibit a fairly large aspect ratio of between 20 and 30.

Figure 7:
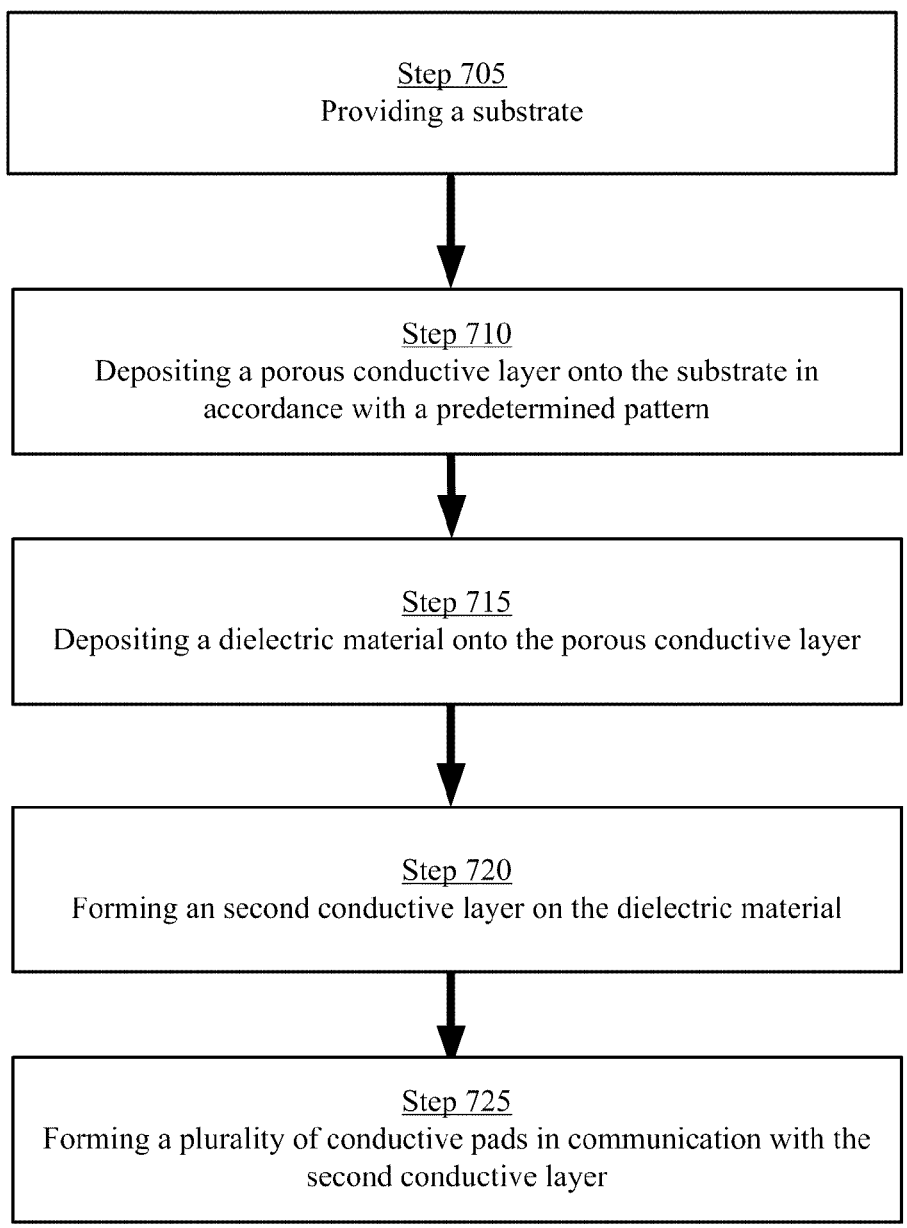
FIG. 7 provides an illustration of a block diagram of the method for providing a high-density capacitor 700 in accordance with an exemplary embodiment of the present invention.

FIG. 7 provides an illustration of a block diagram of the method for providing a high-density capacitor 700 in accordance with an exemplary embodiment of the present invention. As shown in FIG. 7, the first step 705 of an exemplary embodiment of the method for providing a high-density capacitor 700 involves providing a substrate. This substrate can be a silicon substrate or other silicon compatible material. The second step 710 of an exemplary embodiment of the method for providing a high-density capacitor 700 involves depositing a porous conductive layer onto the substrate in accordance with a predetermined pattern. The third step 715 of an exemplary embodiment of the method for providing a high-density capacitor 700 involves depositing a dielectric material onto this porous conductive layer. The fourth step 720 of an exemplary embodiment of the method for providing a high-density capacitor 700 involves forming a second conductive layer on the dielectric material. The fifth step 725 of an exemplary embodiment of the method for providing a high-density capacitor 700 involves forming a plurality of conductive pads in communication with the second conductive layer.

In an alternative embodiment, the method for providing a high-density capacitor 700 includes connecting the plurality of conductive pads to an integrated circuit board. The connection to an integrated circuit board can be accomplished with solder bonding in some embodiments or even with Through-Silicon-Vias in other embodiments. Furthermore, the method for providing a high-density capacitor 700 enables the creation the high-density capacitor system 500, which can be implemented in an silicon stack package.

A high-density capacitor system 500 provided in accordance with an exemplary embodiment of method for providing a high-density capacitor 700 the present invention provides a volumetric efficiency that is superior conventional capacitor designs. For example, an exemplary embodiment of the high-density capacitor system 500 can provide a capacitance density of greater than 50 $\mu F/cm^2$ and even greater than 100 $\mu F/cm^2$ in some embodiments. Furthermore, an exemplary embodiment of the method for providing a high-density capacitor 700 enables the creation a highly thin and planar device. In an exemplary embodiment, the high-density capacitor system 500 can have a thickness, including the substrate layer 505, of less than 500 µm and in some embodiments less 300 µm.

FIGS. 8A-8F provide an illustration of high-density capacitor system 500 in accordance with an exemplary embodiment of the present invention, in which the high-density capacitor system 500 has troughs 805 in the substrate 505. In an exemplary embodiment, as shown in FIG. 8B, the troughs 805 can be created in the substrate 505 by a wet or dry etching process. Those of skill in the art will appreciate that the substrate 505, of the high-density capacitor system 500 exemplary embodiment having trough 805, can be variety of different materials suitable for etching such as silicon or glass. As shown in FIGS. 8C and 8D, in an exemplary embodiment the porous conductive layer 510 forming the bottom electrode and the dielectric material 515 can be formed inside the trough 805. Furthermore, the top and bottom electrodes formed in an exemplary embodiment of the high-density capacitor system 600 can provide external connections through vias 810 and 815, as shown in FIG. 8E.

In an exemplary embodiment, and the second conductive layer 520 forming the top electrode can be dispensed within the troughs 805 and enable self-patterning of the top electrode giving precise control in geometry. In accordance with an exemplary embodiment, the total thickness of the high-density capacitor system 500 can be reduced by fabricating a majority of the system 500 inside the troughs 805.

In an exemplary embodiment, the troughs 805 form a predetermined pattern on the substrate 505. This predetermined pattern can then enable the bottom electrode of the porous conductive layer 510 to be formed in a predetermined pattern, in an exemplary embodiment. The ability to form the bottom electrode on the substrate 505 in specified predetermined pattern enables numerous benefits. First, the pattern for an exemplary embodiment of the bottom electrode can be configured in accordance with the capacitor requirements for a given implementation, device, or product. Second, the pattern for the exemplary embodiment of the bottom electrode can be configured so that the capacitive components created can be connected to independent terminals and be independently addressable.

While the invention has been disclosed in its preferred forms, it will be apparent to those skilled in the art that many modifications, additions, and deletions can be made therein without departing from the spirit and scope of the invention and its equivalents as set forth in the following claims.

What is claimed is:

1. A high-density capacitor system comprising:
    a substrate comprising a plurality of troughs in a predetermined pattern;
    a porous conductive layer comprising a metal-based nanoelectrode particulate formed on the substrate, wherein the porous conductive layer is formed inside one or more of the plurality of troughs in accordance with a predetermined pattern;
    a dielectric material formed on the porous conductive layer;
    a second conductive layer formed on the dielectric material; and
    a plurality of conductive pads configured in communication with the second conductive layer.

2. The high-density capacitor system of claim 1, wherein the system has a thickness of less than 500 µm.

3. The high-density capacitor system of claim 1, wherein the system provides a capacitance density of greater than 40 $\mu F/cm^2$.

4. The high-density capacitor system of claim 1, wherein the system provides a capacitance density of greater than 100 $\mu F/cm^2$.

5. The high-density capacitor system of claim 1, wherein the predetermined pattern defines a plurality of capacitor components.

6. The high-density capacitor system of claim 5, wherein each of the plurality of capacitor components is provided in communication with a pair of the plurality of the conductive pads.

7. The high-density capacitor system of claim 6, wherein pair of the plurality of conductive pads provides an independent terminal for each of the plurality of capacitor components.

8. The high-density capacitor system of claim 1, wherein the system is silicon compatible, ceramic compatible, or glass compatible.

9. The high-density capacitor system of claim 1, wherein at least one of the plurality of conductive pads can be connected to an integrated circuit board.

10. The high-density capacitor system of claim 9, wherein system is connected to a second silicon device via solder bonds.

11. The high-density capacitor system of claim 9, wherein system is connected to a second silicon device with Through-Silicon-Vias.

12. The high-density capacitor system of claim 1, wherein the porous conductive layer is comprised of nanoelectrode particulate.

13. The high-density capacitor system of claim 12, wherein the nanoelectrode particulate is comprised of metal particles, melt-cast porous metal, or diatom frustules.

14. The high-density capacitor system of claim 1, wherein the porous conductive layer is comprised of nanoelectrode particulate and a decomposable polymer to enable control of the pore distribution and porosity.

15. The high-density capacitor system of claim 14, wherein the decomposable polymer is an emulsion or plurality of polymer granules and the particle size of the decomposable polymer ranges from 100 nm to 10 µm.

16. The high-density capacitor system of claim 1, wherein the nanoelectrode particulate is comprised of aluminum, niobium, copper, nickel, titanium, or tantalum.

17. The high-density capacitor system of claim 1, wherein the second conductive layer is separated from the dielectric layer by a thin barrier layer that isolates them both.

18. The high-density capacitor system of claim 1, wherein the second conductive layer is comprised of conducting oxides, metals, or conducting polymers.

19. The high-density capacitor system of claim 1, wherein the substrate is comprised of silicon, glass, or ceramic materials.

20. The high-density capacitor system of claim 1, wherein the second conductive layer is comprised of a conducting polymer, metals, or oxides.

21. The high-density capacitor system of claim 1, wherein the second conductive layer is deposited by vapor deposition and atomic layer deposition.

22. The high-density capacitor system of claim 1, wherein the capacitor layers are inside troughs contained within the substrate.

23. The high-density capacitor system of claim 1, wherein the porous conductive layer is formed in a trough in the substrate.

24. The high-density capacitor system of claim 23, wherein the porous conductive layer, the dielectric material, and the second conductive layer are formed in a trough in the substrate.

25. The high-density capacitor system of claim 23, wherein the trough conforms with the predetermined pattern.

26. A method for providing a high-density capacitor comprising:
   providing a substrate comprising a plurality of troughs in a predetermined pattern;
   depositing a porous conductive layer comprising a metal-based nanoelectrode particulate onto the substrate inside one or more of the plurality of troughs in accordance with a predetermined pattern;
   depositing a dielectric material onto the porous conductive layer;
   forming a second conductive layer on the dielectric material; and
   forming a plurality of conductive pads in communication with the second conductive layer.

27. The method for providing a high-density capacitor of claim 26, wherein the high-density capacitor has a thickness of less than 500 µm.

28. The method for providing a high-density capacitor of claim 26, wherein the high-density capacitor provides a capacitance density of greater than 40 µF/cm$^2$.

29. The method for providing a high-density capacitor of claim 26, wherein the predetermined pattern defines a plurality of capacitor components.

30. The method for providing a high-density capacitor of claim 26, wherein each of the plurality of capacitor components is provided in communication with one of the plurality of the conductive pads.

31. The method for providing a high-density capacitor of claim 30, wherein each of the plurality of conductive pads provides an independent terminal for each of the plurality of capacitor components.

32. The method for providing a high-density capacitor of claim 26, further comprising connecting the plurality of conductive pads to an integrated circuit board.

33. The method for providing a high-density capacitor of claim 26, further comprising connecting the high-density capacitor to a second silicon device via solder bonds, conductive adhesives, metal pad-to-pad bonding.

34. The method for providing a high-density capacitor of claim 26, further comprising connecting the high-density capacitor to a second silicon device with Through-Silicon-Vias.

35. The method for providing a high-density capacitor of claim 26, wherein the porous conductive layer is comprised of micro and nanoparticles that are partially sintered.

36. The method for providing a high-density capacitor of claim 26, wherein the porous conductive layer is deposited in a trough in the substrate.

37. The method for providing a high-density capacitor of claim 26, wherein the porous conductive layer, dielectric material, and second conductive layer are deposited in a trough in the substrate.

* * * * *